United States Patent
Hong

(10) Patent No.: US 9,236,859 B1
(45) Date of Patent: Jan. 12, 2016

(54) POWER CONTROL DEVICE

(71) Applicant: SK hynix Inc., Icheon-si Gyeonggi-do (KR)

(72) Inventor: Yun Seok Hong, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/517,308

(22) Filed: Oct. 17, 2014

(30) Foreign Application Priority Data

Aug. 28, 2014 (KR) ........................ 10-2014-0113460

(51) Int. Cl.
*G05F 1/10* (2006.01)
*H03K 17/687* (2006.01)
*H03K 19/0185* (2006.01)

(52) U.S. Cl.
CPC ...... *H03K 17/687* (2013.01); *H03K 19/018521* (2013.01)

(58) Field of Classification Search
CPC ... H03K 3/0375; H03K 17/22; H03K 17/223; H03K 17/687
See application file for complete search history.

(56) References Cited

U.S. PATENT DOCUMENTS 7,236,003 B2 * 6/2007 Chellamuthu ..... H03K 19/0013 326/14
7,706,192 B2   4/2010 Min et al.

FOREIGN PATENT DOCUMENTS

KR   1020080102023 A   11/2008

* cited by examiner

Primary Examiner — Jeffrey Zweizig
(74) Attorney, Agent, or Firm — William Park & Associates Ltd.

(57) ABSTRACT

A power control device may include a first power-supply voltage source configured to generate a first power-supply voltage, and a second power-supply voltage source configured to generate a second power-supply voltage having a voltage level different from that of the first power-supply voltage. The power control device may include a power driver configured to provide an internal power source in response to the second power-supply voltage, irrespective of the first power-supply voltage source and the second power-supply voltage source, during an initial power-up period.

20 Claims, 8 Drawing Sheets

POWER CONTROL DEVICE

CROSS-REFERENCE TO RELATED APPLICATION

This application claims priority based upon Korean patent application No. 10-2014-0113460, filed on Aug. 28, 2014, the disclosure of which is hereby incorporated in its entirety by reference herein.

BACKGROUND OF THE INVENTION

1. Technical Field

Embodiments of the present invention generally relate to a power control device, and more particularly to a technology for cutting off an unnecessary leakage current path when power of an integrated circuit (IC) having heterogeneous power is ramped up.

2. Related Art

Generally, a power-up signal generation circuit of a semiconductor device indicates a circuit for initializing a semiconductor device. In order to operate the semiconductor device, the power-up signal generation circuit receives an external voltage (VDD) from an external part. The voltage level of the external voltage (VDD) starts from 0V and increases up to a target voltage level at a predetermined slope.

In this case, when all circuits of the semiconductor device directly receive the external voltage (VDD), the circuits need to initialize a specific node as well as to provide stable power. As a result, the semiconductor device includes a power-up signal generation circuit. The power-up signal generation circuit is used to enable a power-up signal, so that the external voltage (VDD) reaching a stable power level can be applied to respective circuits. The semiconductor device is initialized by the power-up operation.

FIG. 1 is a conceptual diagram illustrating a ramp-up operation of the external voltage (VDD) for use in a conventional integrated circuit (IC).

Referring to FIG. 1, the conventional IC has heterogeneous power-supply voltages (VDD1, VDD2). In this case, the external power-supply voltage VDD1 is higher than the external power-supply voltage VDD2.

During a predetermined period T1 of the ramp-up operation, the power-supply voltage VDD1 increases with a predetermined slope, reaches a target level, and is maintained at a predetermined voltage level. After lapse of the period T1, the power-supply voltage VDD2 increases with a predetermined slope. After lapse of a predetermined period T2, the power-supply voltage VDD2 reaches a target level, and is maintained at a predetermined voltage level.

However, before the power-supply voltage VDD1 is ramped up and the power-supply VDD2 is ramped up, an undesired leakage current occurs. That is, if the ramp-up time of the power-supply voltage VDD1 is different from the ramp-up time of the power-supply voltage VDD2, an unnecessary leakage current occurs. As described above, the power-supply voltage VDD2 is maintained at 0V before the power-supply voltages (VDD1, VDD2) are ramped up, so that an internal leakage current unavoidably occurs.

BRIEF SUMMARY

In accordance with an embodiment, the power control device may include a first power-supply voltage source configured to generate a first power-supply voltage, and a second power-supply voltage source configured to generate a second power-supply voltage having a voltage level different from that of the first power-supply voltage. The power control device may include a power driver configured to provide an internal power source in response to the second power-supply voltage, irrespective of the first power-supply voltage source and the second power-supply voltage source, during an initial power-up period.

DESCRIPTION OF EMBODIMENTS

Figure 1:
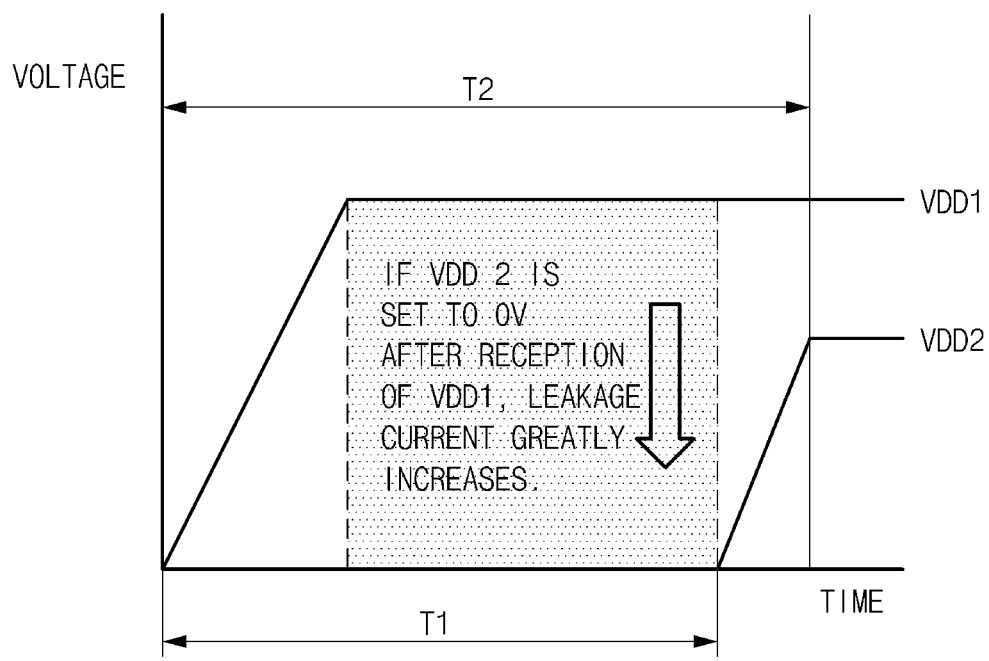
FIG. 1 is a conceptual diagram illustrating a ramp-up operation of an external voltage VDD for use in a conventional integrated circuit (IC).

Reference will now be made in detail to the various embodiments, examples of which are illustrated in the accompanying drawings. Wherever possible, the same reference numbers are used throughout the drawings to refer to the same or like portions. In the following description, a detailed description of related known configurations or functions incorporated herein may be omitted for clarity of the subject matter of the various embodiments.

As semiconductor devices have been rapidly developed to implement higher integration and higher speed, the operation for correctly generating and efficiently distributing a level or category of the external power-supply voltage and a voltage needed for internal parts of the semiconductor devices is of importance to semiconductor technologies.

Multiple external power-supply voltages have been widely used in semiconductor memory devices such as dynamic random access memories (DRAMs) embedded in mobile electronic systems such as a laptop computer, a Portable Multimedia Player (PMP), etc.

That is, the high voltage needed for driving word lines or the like may be generated using a first external power-supply voltage. A voltage for DC power of a peripheral circuit or a core circuit may be generated using a second external power-supply voltage relatively lower than a first external power-supply voltage. In these examples, efficiency and various advantages in terms of power distribution may be provided to the semiconductor devices.

The semiconductor memory device may include an internal power-supply voltage generator configured to generate an internal power-supply voltage needed for operating the semiconductor memory device by reducing a relatively high-level voltage to a predetermined level. The semiconductor memory device may include a reference voltage generator configured to generate a reference voltage needed for operating the internal power-supply voltage generator. The semiconductor memory device may include a boosting voltage (VPP) generator needed for applying the boosted voltage to word lines of memory cells, and a level shifter configured to shift a first-level voltage to a second-level voltage.

The semiconductor memory device may receive multiple power-supply voltages (also called a multi-power-supply voltage), and may be configured to generate a voltage needed for internal parts of the semiconductor memory device. An undesired leakage current path may occur due to a difference in power-up speed of the multiple power-supply voltages, so that a method for preventing the leakage current is needed. When the leakage current path is prevented from occurring, reliability of the voltage generation circuit of the semiconductor device may be guaranteed so that power distribution can be more effectively achieved.

Various embodiments may be directed to providing a power control device which substantially obviates one or more problems due to limitations or disadvantages of the related art.

Various embodiments may relate to a technology for cutting off a path of an unnecessary leakage current when a power-supply voltage of the integrated circuit (IC) having heterogeneous power is ramped up.

Figure 2:
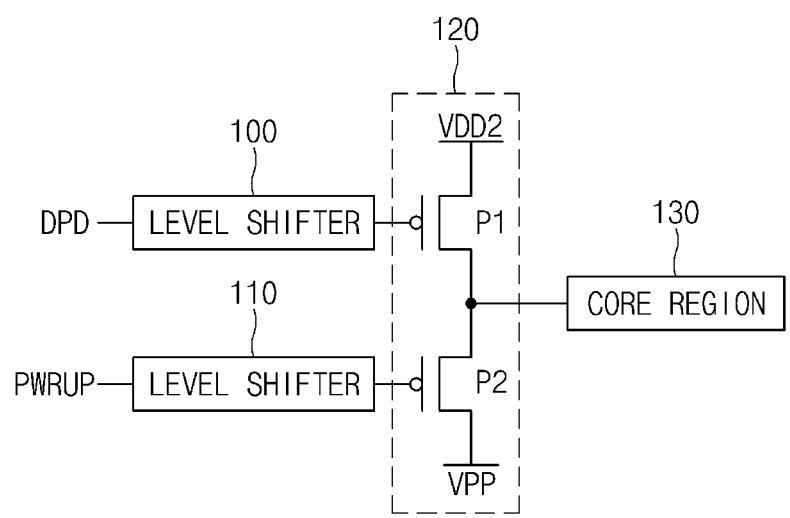
FIGS. 2 to 4 are circuit diagrams of representations of power control devices according to various embodiments.

FIG. 2 is a circuit diagram illustrating a representation of a power control device according to an embodiment.

Referring to FIG. 2, the power control device may include level shifters (100, 110) and a power driver 120. In an embodiment, a first power-supply voltage VDD1 and a second power-supply voltage VDD2 having different voltage levels may be used.

During an initial power-up operation, the level shifter 100 may shift a level of the power-supply voltage in response to a deep-power-down signal (DPD), and may output the level-shifted signal to the power driver 120. In these examples, the level shifter 100 may shift the power-supply voltage (VDD2) level so that it outputs the resultant signal shifted to the power-supply voltage (VDD1) level.

The power-supply voltage VDD1 may be a power-supply voltage generated from a first power-supply voltage source, and the power-supply voltage VDD2 may be a power-supply voltage generated from a second power-supply voltage source. The power-supply voltage VDD1 may be higher than the power-supply voltage VDD2.

During the initial power-up operation, the level shifter 110 may shift a level of the power-supply voltage in response to a power-up signal (PWRUP), and may output the level-shifted signal to the power driver 120. In these examples, the level shifter 110 may shift the power-supply voltage (VDD2) level so that it outputs the resultant signal shifted to the boosting voltage (VPP) level. In these examples, the boosting voltage VPP may be a pumping level obtained by boosting the power-supply voltage VDD1. The boosting voltage VPP may be higher than the power-supply voltage VDD1.

In addition, upon receiving the output signals of the level shifters (100, 110), the power driver 120 may provide a signal having a power-supply voltage (VDD2) level or a boosting voltage (VPP) level to the core region 130 configured to use the internal power-supply voltage.

In these examples, the power driver 120 may selectively output the power-supply voltage (VDD2) level signal to the core region in response to the output signal of the level shifter 100. The power driver 120 may include a PMOS transistor P1. The PMOS transistor P1 is coupled between a power-supply voltage (VDD2) input terminal and an input terminal of the core region 130, so that the PMOS transistor P1 receives the output signal of the level shifter 100 through a gate terminal.

In these examples, the power driver 120 may selectively output the boosting voltage (VPP) level signal to the core region in response to the output signal of the level shifter 110. The power driver 120 may include a PMOS transistor P2. The PMOS transistor P2 may be coupled between a boosting voltage (VPP) input terminal and an input terminal of the core region 130, so that the PMOS transistor P2 receives the output signal of the level shifter 110 through a gate terminal.

Figure 3:
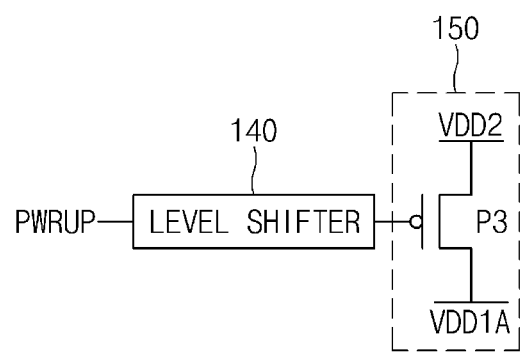

FIG. 3 is a circuit diagram illustrating a representation of a power control device according to an embodiment.

Referring to FIG. 3, the power control device according to an embodiment may include a level shifter 140 and a power driver 150.

During the initial power-up operation, the level shifter 140 may shift a level of the power-supply voltage in response to a power-up signal (PWRUP), and may output the level-shifted signal to the power driver 150. In these examples, the level shifter 140 may shift the power-supply voltage (VDD2) level so that it outputs the resultant signal having the boosting voltage (VPP) level. In these examples, the boosting voltage VPP is higher than the power-supply voltage VDD1.

In addition, the power driver 150 may be selectively coupled between a power-supply voltage (VDD2) input terminal and a power-supply voltage (VDD1A) input terminal in response to the output signal of the level shifter 140. In these examples, the power-supply voltage VDD1A may be generated using the power-supply voltage VDD1 as a power source. The power-supply voltage VDD1A may be lower than the power-supply voltage VDD1 and may be higher than the power-supply voltage VDD2.

The power driver 150 may include a PMOS transistor P3. The PMOS transistor P3 may be coupled between the power-supply voltage (VDD2) input terminal and the power-supply voltage (VDD1A) input terminal, so that the PMOS transistor P3 receives the output signal of the level shifter 140 through the gate terminal.

Figure 4:
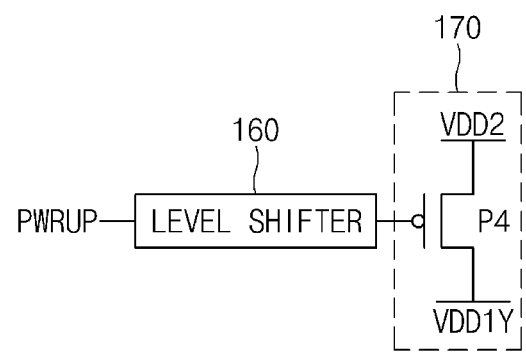

FIG. 4 is a circuit diagram illustrating a representation of a power control device according to an embodiment.

Referring to FIG. 4, the power control device according to an embodiment may include a level shifter 160 and a power driver 170.

During the initial power-up operation, the level shifter 160 may shift a level of the power-supply voltage in response to a power-up signal (PWRUP), and may output the level-shifted signal to the power driver 170. In these examples, the level shifter 160 may shift the power-supply voltage (VDD2) level so that it outputs the resultant signal having the boosting voltage (VPP) level. In these examples, the boosting voltage VPP may be higher than the power-supply voltage VDD1.

In addition, the power driver 170 may be selectively coupled between a power-supply voltage (VDD2) input terminal and a power-supply voltage (VDD1Y) input terminal in response to the output signal of the level shifter 160. In these examples, the power-supply voltage VDD1Y may be generated using the power-supply voltage VDD1 as a power source. The power-supply voltage VDD1Y may be lower than the power-supply voltages (VDD1, VDD1A), may have the same level as in the power-supply voltage VDD2, or may be lower than the power-supply voltage VDD2.

The power driver 170 may include a PMOS transistor P4. The PMOS transistor P4 may be 3 coupled between the power-supply voltage (VDD2) input terminal and the power-supply voltage (VDD1Y) input terminal, so that the PMOS transistor P4 receives the output signal of the level shifter 160 through the gate terminal.

The power control device according to the embodiments may be configured to use the power-supply voltage VDD2 as an internal power source during the deep-power-down (DPD) mode or the initial power-up mode. Irrespective of the power-supply voltage (VDD1) source and the power-supply voltage (VDD2) source, all the internal power sources may be the power-supply voltage VDD2. In these examples, each of the deep-power-down signal (DPD) and the power-up signal (PWRUP) may use the power-supply voltage VDD2 as a power source.

As can be seen from FIG. 1, during a predetermined period T1 of the initial ramp-up mode, the power-supply voltage VDD1 increases with a predetermined slope, reaches a target level, and is maintained at a predetermined voltage level. After lapse of the period T1, the power-supply voltage VDD2 increases with a predetermined slope.

Thereafter, after lapse of a predetermined period T2, if the power-supply voltage VDD2 reaches a target level and is maintained at a predetermined voltage level. In other words, before the power-supply voltage VDD1 is ramped up and the power-supply voltage VDD2 is ramped up, the power-supply voltage VDD2 is maintained at 0V during the period T1.

For example, if the deep-power-down signal (DPD) or the power-up signal (PWRUP) is activated during the initial power-up operation, the PMOS transistors P1~P4 are turned on. However, since each of the deep-power-down signal (DPD) and the power-up signal (PWRUP) uses the power-supply voltage VDD2 as a power source, if the power-supply voltage VDD2 is set to 0V during the initial power-up period, the power drivers (120, 150, 170) are floated.

In these cases, a leakage current may occur in the core region 130. However, during the initial power-up operation, the power-supply voltage VDD2 is used as the internal power source. As a result, the power-supply voltage VDD2 is applied to a high-voltage (VPP) terminal, a power-supply voltage (VDD1A) terminal, or a power-supply voltage (VDD1Y) terminal.

During the period T1, the power-supply voltage VDD2 is maintained at 0V as described above. Therefore, the high-voltage (VPP) terminal, the power-supply voltage (VDD1A) terminal, or the power-supply voltage (VDD1Y) terminal is set to the power-supply voltage (VDD2) level (i.e., 0V), resulting in the occurrence of a short-circuited state. As a result, a leakage current path may be prevented from occurring in the initial power-up period (i.e., T1 period) before the power-supply voltage VDD2 is ramped up.

The level shifter has been widely used in various digital circuits configured to increase a voltage level of a target signal up to a predetermined voltage level. The level shifter may generate the output voltage to be higher or lower than the voltage level received from the semiconductor integrated circuit, and may be used as an interface between circuits having different levels.

A level-shifting speed, a static current, a drive current, etc. from among characteristics of the level shifter are of importance. In the level shifter, the static current is a current flowing through a DC current path formed after completion of input-voltage amplifying (i.e., after completion of level-shifting).

Figure 5:
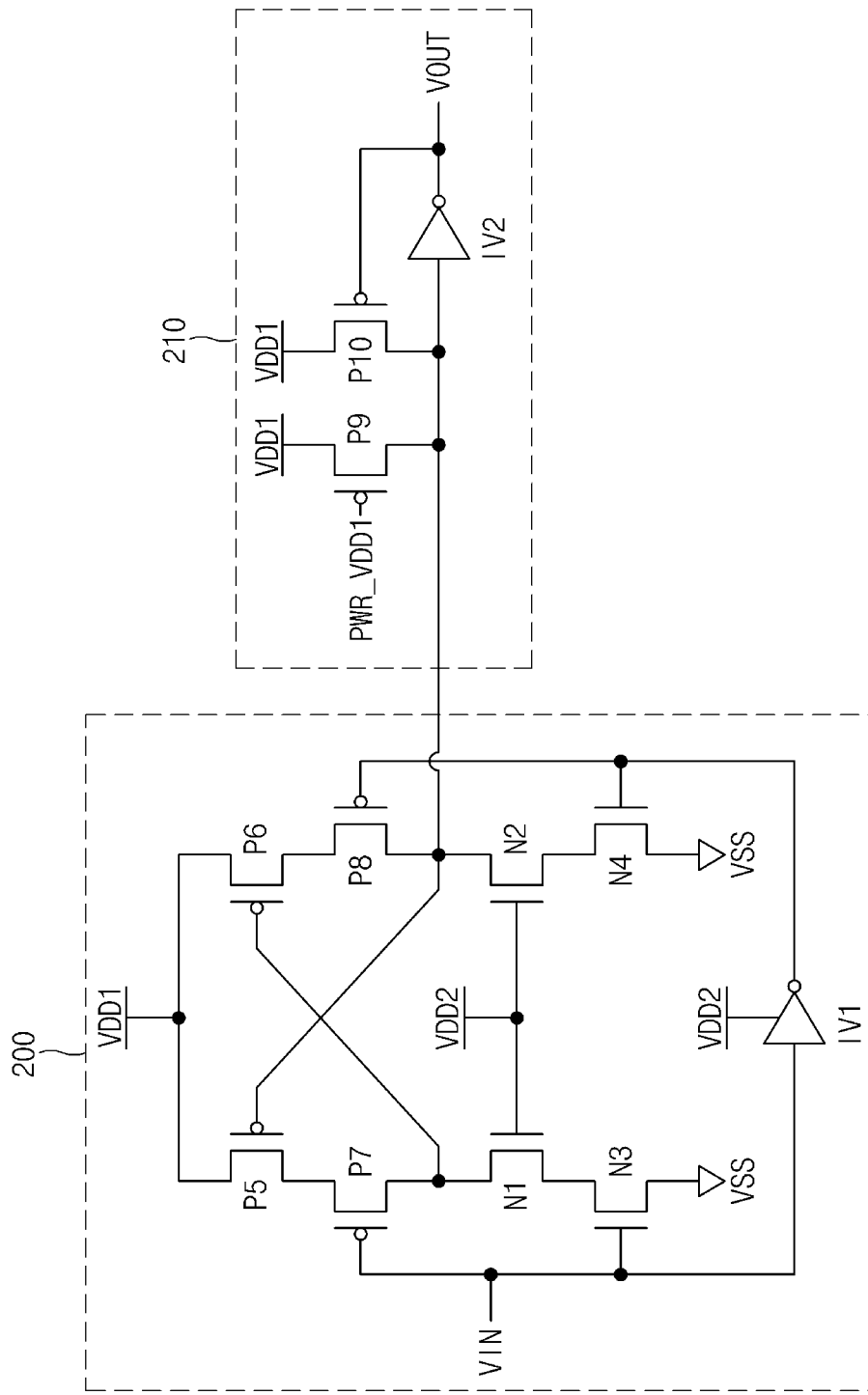
FIGS. 5 and 6 are representations of circuit diagrams illustrating a level shifter according to various embodiments.

FIG. 5 is a circuit diagram illustrating a representation of a level shifter according to an embodiment. The level shifter of FIG. 5 may be any one of the level shifters (100, 110, 140, 160) illustrated in FIGS. 2 to 4. For convenience of description and better understanding of the embodiments, the level shifter may also be denoted by another reference number without departing from the scope or spirit of the embodiments.

The level shifter may include an amplification unit 200 and an output unit 210. The level shifter may be implemented as, for example but not limited to, a cross-coupled differential amplifier.

The amplification unit 200 may include a plurality of PMOS transistors P5~P8, a plurality of NMOS transistors N1~N4, and an inverter IV1. The power-supply voltage VDD1 acting as the operating voltage may be applied to source terminals of the PMOS transistors (P5, P6). The power-supply voltage VDD2 acting as the operating voltage may be applied to the NMOS transistors (N1, N2) and the inverter IV1.

The PMOS transistors (P5, P7) and the NMOS transistors (N1, N3) may be coupled in series between the power-supply voltage (VDD1) input terminal and the ground voltage (VSS) terminal. The PMOS transistors (P6, P8) and the NMOS transistors (N2, N4) may be coupled in series between the power-supply voltage (VDD1) input terminal and the ground voltage (VSS) terminal.

The PMOS transistors (P5~P8) may be cross-coupled to one another. Each of the PMOS transistor P7 and the NMOS transistor N3 may receive an input signal VIN through respective gate terminals. Each of the PMOS transistor P8 and the NMOS transistor N4 may receive an input signal VIN inverted by the inverter IV1 through their respective gate terminals.

In these examples, the inverter IV2 may be driven by the power-supply voltage VDD2. Each of the NMOS transistor N1 and the NMOS transistor N2 may receive the power-supply voltage VDD2 through respective gate terminals.

The output unit 210 may include PMOS transistors (P9, P10), acting as pull-up elements, and an inverter IV2. The PMOS transistor P10 and the inverter IV2 may be used as a latch unit for latching an output signal of the amplification unit 200.

The PMOS transistor P9 may be coupled between the power-supply voltage (VDD1) input terminal and the output terminal of the amplification unit 200, so that the PMOS transistor P9 receives a control signal (PWR_VDD1) through its own gate terminal. In these examples, the control signal (PWR_VDD1) may be generated by detecting the power-supply voltage (VDD1) level.

The PMOS transistor P10 may be coupled between the power-supply voltage (VDD1) input terminal and the output terminal of the amplification unit 200, so that the PMOS transistor P10 may receive the output signal VOUT through its own gate terminal. The inverter IV2 may invert the output signal of the drain terminal of the PMOS transistor P9 or P10, so that the inverter IV2 may output the output signal VOUT.

If the input signal (VIN) of the amplification unit 200 is at a high level, the NMOS transistor N3 and the PMOS transistor P6 are turned on. A logic-low level may be applied to the PMOS transistor P8 by an inverted output signal of the inverter IV1, so that the PMOS transistor P8 is turned on. As a result, a high-level output signal shifted to the power-supply voltage (VDD1) level is applied to the output unit 210 through the output terminal of the amplification unit 200.

If the output signal of the amplification unit 200 is at a high level, the output signal VOUT may transition to a logic low level by the inverter IV2. Thereafter, the PMOS transistor P10 is turned on by the inverted output signal of the inverter IV2, so that the output signal of the amplification unit 200 may be latched.

On the other hand, if the input signal VIN of the amplification unit 200 is at a low level, the PMOS transistor P7 may be turned on. The NMOS transistor N4 may be turned on by the inverted output signal of the inverter IV1. As a result, a low-level signal is output through an output terminal of the amplification unit 200.

However, as can be seen from FIG. 1, the power-supply voltage VDD2 is maintained at 0V during the period T1 located before the power-supply voltage VDD2 is ramped up. As a result, the input signal VIN of the amplification unit 200 is floated, and the output signal of the inverter IV2 is also floated.

Therefore, the output signal of the amplification unit 200 is floated, so that it is impossible to recognize a level of the output voltage VOUT. In this case, the internal power source of the internal core region 130 may not be set to a desired level.

In accordance with an embodiment, the output signal of the amplification unit 200 may be pulled up in response to the control signal (PWR_VDD1), and may then be latched. As a result, the output signal VOUT may be driven at a low level, such that an unnecessary leakage current may be prevented from occurring.

That is, if the control signal (PWR_VDD1) is at a high level, the PMOS transistor P2 remains turned off. On the other hand, if the control signal (PWR_VDD1) is at a low level during the initial power-up operation, the PMOS transistor P9 is turned on, so that the output terminal of the amplification unit 200 is pulled up to the power-supply voltage (VDD1) level.

Accordingly, the PMOS transistor P9 may output a high-level signal having the power-supply voltage (VDD1) level to the latch unit (including the PMOS transistor P10 and the inverter IV2) during a predetermined time period in which the control signal (PWR_VDD1) is at a low level. The latch unit may latch the high-level signal for a predetermined time so as to initialize the output signal VOUT to a low level, and the initialized low-level output signal VOUT may be output to cut off a leakage current path. In these examples, a predetermined time in which the latch unit latches the output signal of the PMOS transistor P9 may be extended to a time section located before the power-supply voltage VDD2 is ramped up.

Figure 7:
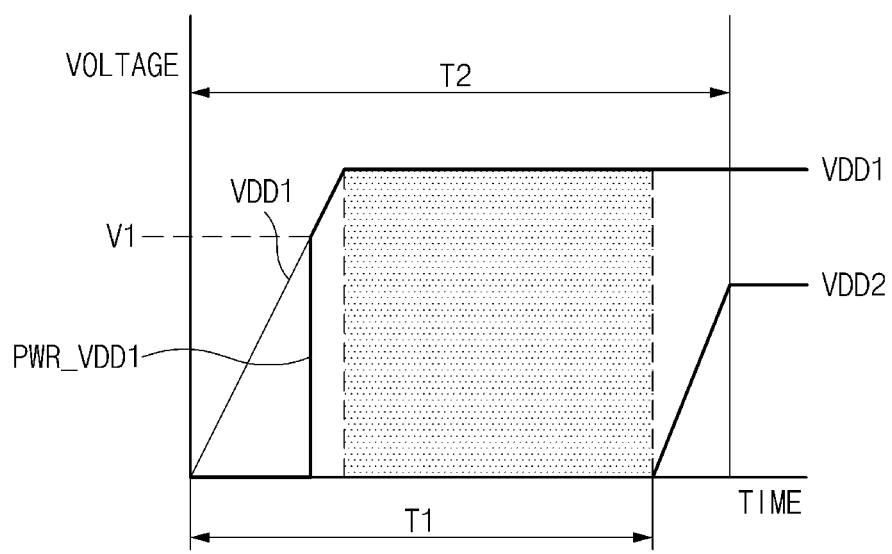
FIG. 7 is a representation of a conceptual diagram illustrating control signals illustrated in FIGS. 5 and 6.

The control signal (PWR_VDD1) may be generated by detecting the power-supply voltage (VDD1) level. In other words, as can be seen from FIG. 7, if the power-supply voltage (VDD1) level is less than a specific voltage level V1, the control signal (PWR_VDD1) transitions to a low level. In contrast, if the power-supply voltage (VDD1) level is equal to or higher than the specific voltage level V1, the control signal (PWR_VDD1) transitions to a high level so that the control signal (PWR_VDD1) follows the power-supply voltage (VDD1) level.

Figure 6:
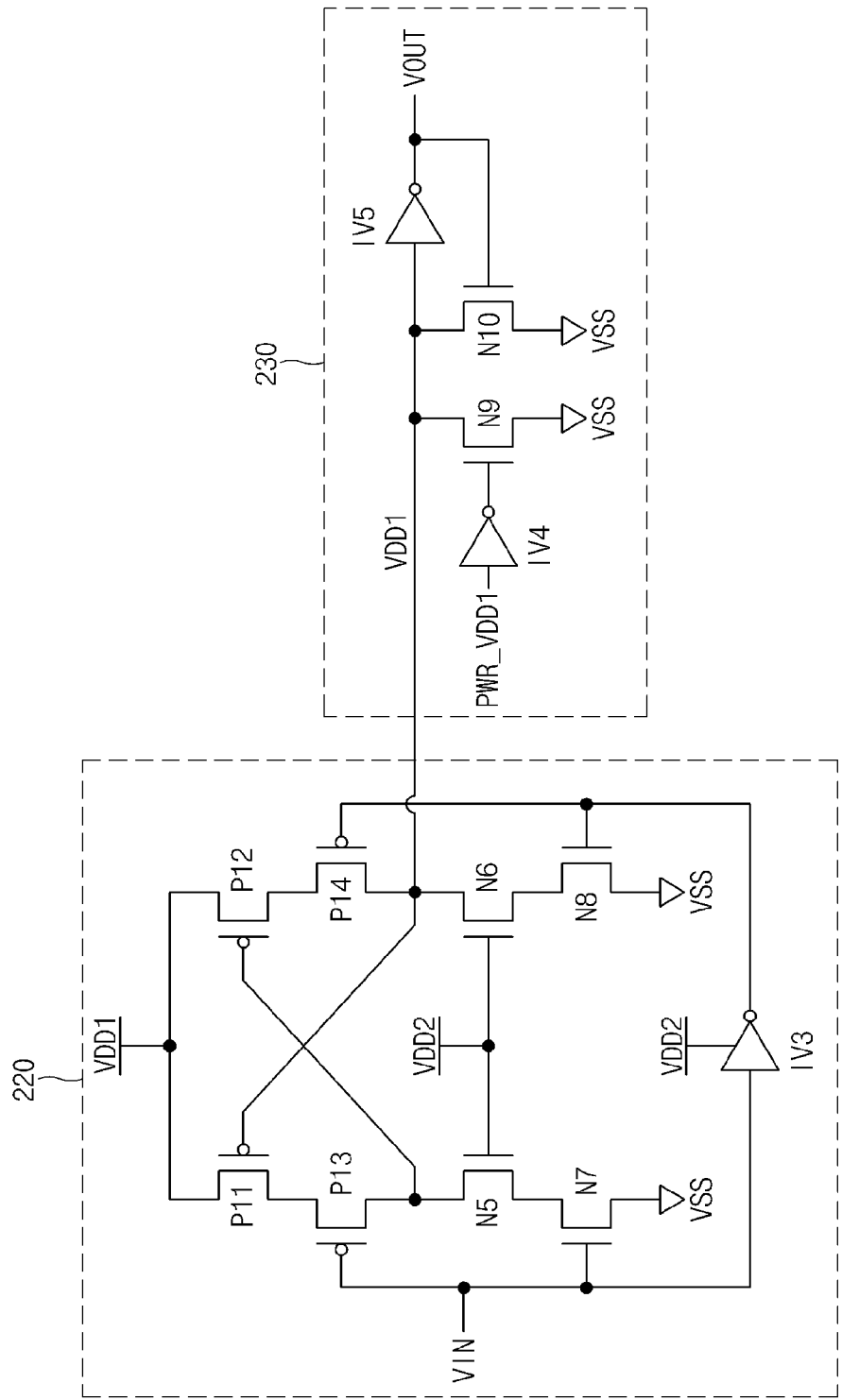

FIG. 6 is a circuit diagram illustrating a representation of a level shifter according to an embodiment. The level shifter of FIG. 6 may be any one of the level shifters (100, 110, 140, 160) illustrated in FIGS. 2 to 4. For convenience of description and better understanding of the embodiments, the level shifter may also be denoted by another reference number without departing from the scope or spirit of the embodiments.

The level shifter may include an amplification unit 220 and an output unit 230. The level shifter may be implemented as, for example but not limited to, a cross-coupled differential amplifier.

The amplification unit 220 may include a plurality of PMOS transistors P11~P14, a plurality of NMOS transistors N5~N8, and an inverter IV3. The power-supply voltage VDD1 acting as the operating voltage may be applied to source terminals of the PMOS transistors (P11, P12). The power-supply voltage VDD2 acting as the operating voltage may be applied to the NMOS transistors (N5, N6) and the inverter IV3.

The PMOS transistors (P11, P13) and the NMOS transistors (N5, N7) may be coupled in series between the power-supply voltage (VDD1) input terminal and the ground voltage (VSS) terminal. The PMOS transistors (P12, P14) and the NMOS transistors (N6, N8) may be coupled in series between the power-supply voltage (VDD1) input terminal and the ground voltage (VSS) terminal.

The PMOS transistors (P11~P14) may be cross-coupled to one another. Each of the PMOS transistor P13 and the NMOS transistor N7 may receive an input signal VIN through respective gate terminals. Each of the PMOS transistor P14 and the NMOS transistor N8 may receive an input signal VIN inverted by the inverter IV3 through respective gate terminals.

In these examples, the inverter IV3 is driven by the power-supply voltage VDD2. Each of the NMOS transistor N5 and the NMOS transistor N6 may receive the power-supply voltage VDD2 through respective gate terminals.

The output unit 230 may include NMOS transistors (N9, N10) acting as pull-down elements, and inverters (IV4, IV5). The NMOS transistor N10 and the inverter IV5 may be used as a latch unit for latching output signals of the amplification unit 220 and the NMOS transistor N9.

The NMOS transistor N9 may be coupled between the ground voltage (VSS) terminal and the output terminal of the amplification unit 220, so that the NMOS transistor N9 receives a control signal (PWR_VDD1) inverted by the inverter IV4 through its own gate terminal. In these examples, the control signal (PWR_VDD1) may be generated by detecting the power-supply voltage (VDD1) level.

The NMOS transistor N10 may be coupled between the ground voltage (VSS) terminal and the output terminal of the amplification unit 220, so that the NMOS transistor N10 may receive the output signal VOUT through its own gate terminal. The inverter IV5 may invert the output signals of the drain terminals of the NMOS transistors (P9, P10), so that the inverter IV5 may output the output signal VOUT.

If the input signal (VIN) of the amplification unit 220 is at a high level, the NMOS transistor N7 and the PMOS transistor P12 are turned on. A logic-low level may be applied to the PMOS transistor P14 by an inverted output signal of the inverter IV3, so that the PMOS transistor P14 is turned on. As a result, a high-level output signal shifted to the power-supply voltage (VDD1) level is applied to the output unit 230 through the output terminal of the amplification unit 220.

If the output signal of the amplification unit 220 is at a high level, the output signal VOUT may transition to a logic low level by the inverter IV5. Thereafter, the NMOS transistor N10 is turned on by the inverted output signal of the inverter IV5, so that the output signal of the amplification unit 220 may be latched.

On the other hand, if the input signal VIN of the amplification unit 220 is at a low level, the PMOS transistor P13 may be turned on. The NMOS transistor N8 may be turned on by the inverted output signal of the inverter IV3. As a result, a low-level signal is output through an output terminal of the amplification unit 220.

However, as can be seen from FIG. 1, the power-supply voltage VDD2 is maintained at 0V during the period T1 located before the power-supply voltage VDD2 is ramped up. As a result, the input signal VIN of the amplification unit 220 is floated, and the output signal of the inverter IV3 is also floated.

Therefore, the output signal of the amplification unit 220 is floated, so that it is impossible to recognize a level of the output voltage VOUT. In this case, the internal power source of the internal core region 130 may not be set to a desired level.

In accordance with an embodiment, the output signal of the amplification unit 220 may be pulled down in response to the control signal (PWR_VDD1), and may then be latched. As a result, the output signal VOUT may be driven at a high level, such that an unnecessary leakage current may be prevented from occurring.

That is, if the control signal (PWR_VDD1) is at a high level, the NMOS transistor N9 remains turned off in response to an inverting signal of the inverter IV4. On the other hand, if the control signal (PWR_VDD1) is at a low level during the initial power-up operation, the NMOS transistor N9 is turned on, so that the output terminal of the amplification unit 220 is pulled down to the ground voltage (VSS) level.

Accordingly, the NMOS transistor N9 may output a low-level signal having the ground voltage (VSS) level to the latch unit (including the NMOS transistor N10 and the inverter IV5) during a predetermined time period in which the control signal (PWR_VDD1) is at a low level. The latch unit may latch the low-level signal for a predetermined time so as to initialize the output signal VOUT to a low level, and the initialized low-level output signal VOUT may be output to cut off a leakage current path. In these examples, a predetermined time in which the latch unit latches the output signal of the NMOS transistor N9 may be extended to a time section located before the power-supply voltage VDD2 is ramped up.

The control signal (PWR_VDD1) may be generated by detecting the power-supply voltage (VDD1) level. In other words, as can be seen from FIG. 7, if the power-supply voltage (VDD1) level is less than a specific voltage level V1, the control signal (PWR_VDD1) transitions to a low level. In contrast, if the power-supply voltage VDD1 level is equal to or higher than the specific voltage level V1, the control signal (PWR_VDD1) transitions to a high level so that the control signal (PWR_VDD1) follows the power-supply voltage (VDD1) level.

As described above, the power control device according to the embodiments may initialize the output signals of the level shifters (100, 110, 140, 160) to a desired level during the initial power-up operation. During the initial power-up operation, the power-supply voltage VDD2 may be used as power source of the power drivers (120, 150, 170) in such a manner that the internal power source applied to the core region 130 is short-circuited, such that an unnecessary leakage current may be prevented from occurring in the internal circuit.

As is apparent from the above description, the power control device according to various embodiments may cut off a path of an unnecessary leakage current when a power-supply voltage of the integrated circuit having heterogeneous power is ramped up, so that it may reduce the power consumption and prevent the occurrence of boot failure.

Figure 8:
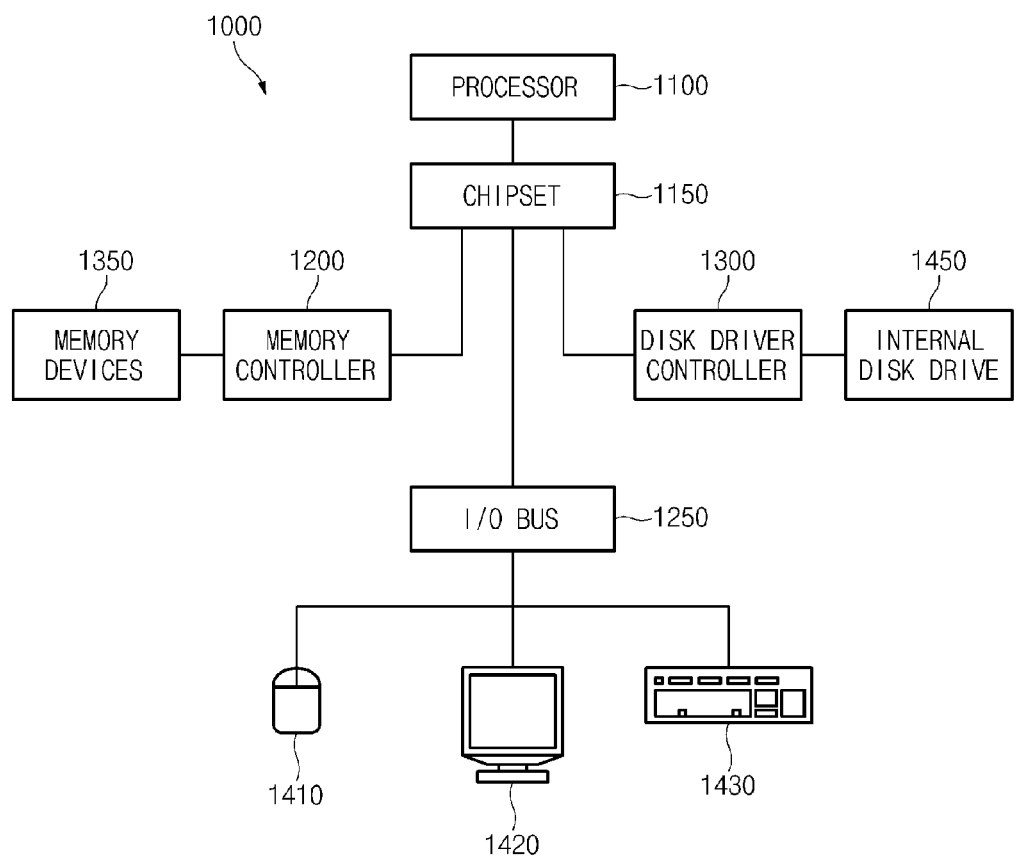
FIG. 8 illustrates a block diagram of an example of a representation of a system employing the power control device in accordance with the embodiments discussed above with relation to FIGS. 2-7.

The power control devices discussed above (see FIGS. 2-7) are particular useful in the design of memory devices, processors, and computer systems. For example, referring to FIG. 8, a block diagram of a system employing the power control devices in accordance with the embodiments are illustrated and generally designated by a reference numeral 1000. The system 1000 may include one or more processors or central processing units ("CPUs") 1100. The CPU 1100 may be used individually or in combination with other CPUs. While the CPU 1100 will be referred to primarily in the singular, it will be understood by those skilled in the art that a system with any number of physical or logical CPUs may be implemented.

A chipset 1150 may be operably coupled to the CPU 1100. The chipset 1150 is a communication pathway for signals between the CPU 1100 and other components of the system 1000, which may include a memory controller 1200, an input/output ("I/O") bus 1250, and a disk drive controller 1300. Depending on the configuration of the system, any one of a number of different signals may be transmitted through the chipset 1150, and those skilled in the art will appreciate that the routing of the signals throughout the system 1000 can be readily adjusted without changing the underlying nature of the system.

As stated above, the memory controller 1200 may be operably coupled to the chipset 1150. The memory controller 1200 may include at least one power control device as discussed above with reference to FIGS. 2-7. Thus, the memory controller 1200 can receive a request provided from the CPU 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the at least one power control device as discussed above with relation to FIGS. 2-7, the memory devices 1350 may include a plurality of word lines and a plurality of bit lines for defining a plurality of memory cell. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430. The I/O bus 1250 may employ any one of a number of communications protocols to communicate with the I/O devices 1410, 1420, and 1430. Further, the I/O bus 1250 may be integrated into the chipset 1150.

The disk drive controller 1450 (i.e., internal disk drive) may also be operably coupled to the chipset 1150. The disk drive controller 1450 may serve as the communication pathway between the chipset 1150 and one or more internal disk drives 1450. The internal disk drive 1450 may facilitate disconnection of the external data storage devices by storing both instructions and data. The disk drive controller 1300 and the internal disk drives 1450 may communicate with each other or with the chipset 1150 using virtually any type of communication protocol, including all of those mentioned above with regard to the I/O bus 1250.

It is important to note that the system 1000 described above in relation to FIG. 8 is merely one example of a system employing the power control device as discussed above with relation to FIGS. 2-7. In alternate embodiments, such as cellular phones or digital cameras, the components may differ from the embodiments illustrated in FIG. 8.

Those skilled in the art will appreciate that the embodiments may be carried out in other specific ways than those set forth herein without departing from the spirit and essential characteristics of the embodiments. The above embodiments are therefore to be construed in all aspects as illustrative and not restrictive. The scope of the embodiments should be determined by the appended claims and their legal equivalents, not by the above description. Further, all changes coming within the meaning and equivalency range of the appended claims are intended to be embraced therein. In addition, it is obvious to those skilled in the art that claims that are not explicitly cited in each other in the appended claims may be presented in combination as an embodiment or included as a new claim by a subsequent amendment after the application is filed.

Although a number of illustrative embodiments have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings and the accompanying claims. In addition to variations and modifications in the component parts and/or arrangements, alternative uses will also be apparent to those skilled in the art.

What is claimed is:

1. A power control device comprising:
   a first power-supply voltage source configured to generate a first power-supply voltage;
   a second power-supply voltage source configured to generate a second power-supply voltage having a voltage level different from that of the first power-supply voltage; and
   a power driver configured to provide an internal power source in response to the second power-supply voltage, irrespective of the first power-supply voltage source and the second power-supply voltage source, during an initial power-up period.

2. The power control device according to claim 1, wherein the first power-supply voltage is higher in level than the second power-supply voltage.

3. The power control device according to claim 1, further comprising:
   a first level shifter configured to shift the second power-supply voltage level to the first power-supply voltage level in response to a deep-power-down (DPD) signal and to provide the level-shifted resultant signal to the power driver.

4. The power control device according to claim 1, further comprising:
   a second level shifter configured to shift the second power-supply voltage level to a boosting-voltage level in response to a power-up signal and to provide the resultant signal shifted to the boosting-voltage level to the power driver.

5. The power control device according to claim 4, wherein the boosting voltage is higher in level than the first power-supply voltage.

6. The power control device according to claim 1, wherein:
   after the first power-supply voltage is ramped up during the initial power-up period, the second power-supply voltage is ramped up.

7. The power control device according to claim 1, wherein the power driver is configured to short-circuit the internal power source when the second power-supply voltage having a logic low level is applied to the internal power source during the initial power-up period.

8. The power control device according to claim 7, wherein the internal power source is applied to a boosting-voltage input terminal.

9. The power control device according to claim 7, wherein the internal power source is applied to a source terminal of the first power-supply voltage.

10. The power control device according to claim 1, further comprising:
    a level shifter configured to shift the second power-supply voltage to the first power-supply voltage in response to an input signal during the initial power-up period, and output the resultant signal shifted to the first power-supply voltage level to the power driver.

11. The power control device according to claim 10, wherein the level shifter includes:
    an amplification unit configured to amplify the input signal to the first power-supply voltage level; and
    an output unit configured to set an output signal of the amplification unit to a predetermined logic level during the initial power-up period in response to a control signal, and output the resultant signal having the predetermined logic level.

12. The power control device according to claim 11, wherein:
    the control signal is at a logic low level when the first power-supply voltage is less than a predetermined level, and transitions to a logic high level when the first power-supply voltage is equal to or higher than the predetermined level.

13. The power control device according to claim 11, wherein the output unit outputs the output signal having a logic low level according to the control signal being changed in response to the first power-supply voltage level.

14. The power control device according to claim 11, wherein the output unit includes:
    a first pull-up element coupled between an input terminal of the first power-supply voltage and an output terminal of the amplification unit and configured to pull-up drive the output terminal of the amplification unit in response to the control signal; and
    a first latch unit configured to latch an output signal of the first pull-up element.

15. The power control device according to claim 14, wherein the first latch unit includes:
    a second pull-up element coupled between an input terminal of the first power-supply voltage and an output terminal of the first pull-up element in such a manner that the second pull-up element is controlled by the output signal; and
    a first inverter configured to invert an output signal of the second pull-up element, and output the inverted output signal.

16. The power control device according to claim 14, wherein the first latch unit maintains a latch status before the second power-supply voltage is ramped up.

17. The power control device according to claim 11, wherein the output unit outputs the output signal having a logic high level according to the control signal being changed in response to the first power-supply voltage level.

18. The power control device according to claim 11, wherein the output unit includes:
    a first pull-down element coupled between a ground voltage terminal and an output terminal of the amplification unit and configured to pull-down drive the output terminal of the amplification unit; and
    a second latch unit configured to latch an output signal of the first pull-down element.

19. The power control device according to claim 18, wherein the second latch unit includes:
    a second pull-down element coupled between a ground voltage terminal and an output terminal of the first pull-down element in such a manner that the second pull-down element is controlled by the output signal; and
    a second inverter configured to invert an output signal of the second pull-down element, and output the inverted output signal.

20. The power control device according to claim 18, wherein the second latch unit maintains a latch status before the second power-supply voltage is ramped up.

* * * * *